(12) United States Patent
Yodo (10) Patent No.: US 9,449,878 B2
(45) Date of Patent: Sep. 20, 2016

(54) WAFER PROCESSING METHOD

(71) Applicant: DISCO CORPORATION, Tokyo (JP)

(72) Inventor: Yoshiaki Yodo, Tokyo (JP)

(73) Assignee: Disco Corporation, Tokyo (JP)

( * ) Notice: Subject to any disclaimer, the term of this patent is extended or adjusted under 35 U.S.C. 154(b) by 0 days.

(21) Appl. No.: 14/618,427

(22) Filed: Feb. 10, 2015

(65) Prior Publication Data

US 2015/0243560 A1   Aug. 27, 2015

(30) Foreign Application Priority Data

Feb. 21, 2014  (JP) .................... 2014-032293

(51) Int. Cl.
| | |
|---|---|
| *H01L 21/78* | (2006.01) |
| *H01L 21/304* | (2006.01) |
| *H01L 21/683* | (2006.01) |
| *H01L 21/311* | (2006.01) |

(52) U.S. Cl.
CPC ........... *H01L 21/78* (2013.01); *H01L 21/3043* (2013.01); *H01L 21/31105* (2013.01); *H01L 21/31127* (2013.01); *H01L 21/6835* (2013.01); *H01L 21/6836* (2013.01); *H01L 2221/6834* (2013.01); *H01L 2221/68327* (2013.01)

(58) Field of Classification Search
CPC ............... H01L 21/3043; H01L 21/78; H01L 2221/68336; H01L 2223/5446; H01L 24/95
USPC ..................... 438/33, 68, 458–465
See application file for complete search history.

(56) References Cited

U.S. PATENT DOCUMENTS

| | | | | |
|---|---|---|---|---|
| 5,284,792 | A * | 2/1994 | Forster et al. ........ | H01S 5/0201 148/DIG. 28 |
| 5,904,548 | A * | 5/1999 | Orcutt ..................... | H01L 21/78 257/E21.599 |
| 9,209,085 | B2 * | 12/2015 | Uchida et al. ...... | H01L 21/6835 |
| 9,293,372 | B2 * | 3/2016 | Nagaoka et al. ... | H01L 21/6835 |
| 2004/0161940 | A1 * | 8/2004 | Daii et al. ......... | H01L 21/02046 438/706 |
| 2005/0095750 | A1 * | 5/2005 | Lo et al. ................. | H01L 21/56 438/114 |
| 2009/0011572 | A1 * | 1/2009 | Kaneko .............. | B23K 26/0853 438/463 |
| 2009/0280622 | A1 * | 11/2009 | Genda et al. ........... | H01L 21/78 438/462 |
| 2010/0041210 | A1 * | 2/2010 | Hoshino et al. .. | H01L 21/67092 438/463 |
| 2011/0312157 | A1 * | 12/2011 | Lei et al. ................ | H01L 21/78 438/462 |

FOREIGN PATENT DOCUMENTS

JP   2005-064231   3/2005

* cited by examiner

*Primary Examiner* — Amar Movva
*Assistant Examiner* — Omar Mojaddedi
(74) *Attorney, Agent, or Firm* — Greer Burns & Crain Ltd.

(57) ABSTRACT

A wafer processing method includes a cut groove forming step of positioning, from a back side of the substrate, a cutting blade to an area corresponding to a division line to form cut grooves in such a manner that the cutting blade does not reach a functional layer and part of a substrate is left, and a functional layer cutting step of performing irradiation with a laser beam along the division lines formed in the functional layer forming a wafer to perform ablation processing for the functional layer and cut the functional layer. In the cut groove forming step, the cut grooves are formed along the division lines in such a manner that an uncut part is left in a peripheral area of the wafer.

1 Claim, 7 Drawing Sheets

WAFER PROCESSING METHOD

BACKGROUND OF THE INVENTION

1. Field of the Invention

The present invention relates to a wafer processing method for dividing, along plural division lines, a wafer in which devices are formed in plural areas partitioned by the division lines formed in a lattice manner in a functional layer stacked on a surface of a substrate.

2. Description of the Related Art

Recently, a semiconductor wafer has been put into practical use with a form in which semiconductor devices are formed by a functional layer including a low dielectric constant insulator coat (Low-k film) that is formed over a surface of a substrate of silicon or the like and is formed of a film based on an inorganic substance such as SiOF or BSG (SiOB) or a film based on an organic substance as a polymer film of a polyimide-based material, a parylene-based material, or the like in order to improve the processing ability of semiconductor chips such as ICs and LSIs. The Low-k film is difficult to cut by a cutting blade. Specifically, the Low-k film is very fragile like mica and therefore involves the following problem. When cutting is performed by a cutting blade along the division line, the Low-k film peels off and this peeling reaches circuitry, which gives fatal damage to the devices.

To solve the above-described problem, the following wafer dividing method is disclosed in Japanese Patent Laid-open No. 2005-64231. Specifically, irradiation with a laser beam is performed along division lines formed on a semiconductor wafer to form laser-processed grooves along the division lines and split a functional layer. Then, a cutting blade is positioned to the laser-processed groove and the cutting blade and the semiconductor wafer are moved relative to each other to cut the semiconductor wafer along the division lines.

SUMMARY OF THE INVENTION

However, the wafer dividing method in which irradiation with a laser beam is performed along division lines formed on a semiconductor wafer to form laser-processed grooves along the division lines and split a functional layer and then a cutting blade is positioned to the laser-processed groove and the semiconductor wafer is cut along the division lines as described in Japanese Patent Laid-open No. 2005-64231 has the following problems.

(1) Even when the width of the laser-processed groove is sufficient, the cutting blade gets contact with a fused material adhering to a side surface of the laser-processed groove and a crack is suddenly caused at the periphery of a device.

(2) If removal of the functional layer is insufficient when the laser-processed grooves are formed, the deviation or leaning of the cutting blade occurs and peeling occurs in the functional layer of a device.

(3) Because the laser-processed grooves are formed in a range exceeding the width of the cutting blade, the width of the division lines needs to be set large and the number of devices formed on the wafer decreases.

(4) Because a passivation film including $SiO_2$, SiN, or the like is formed on the surface of the functional layer, when irradiation with a laser beam is performed, the laser beam is transmitted through the passivation film and reaches the inside of the functional layer. As a result, the energy of the laser beam that has reached the inside of the functional layer has no escape route and a so-called undercut phenomenon occurs in which the processing expands to the device side, on which circuitry is formed and the density is low.

Therefore, an object of the present invention is to provide a wafer processing method that can divide, into individual devices, a wafer in which the devices are formed in plural areas partitioned by plural division lines formed in a lattice manner in a functional layer formed on a surface of a substrate, with the above-described problems solved.

In accordance with an aspect of the present invention, there is provided a wafer processing method for dividing, along a plurality of division lines, a wafer in which devices are formed in a plurality of areas partitioned by the division lines formed in a lattice manner in a functional layer formed on a front side of a substrate. The wafer processing method includes a protective member sticking step of sticking a protective member onto a front side of the functional layer of the wafer, and a cut groove forming step of holding, on a chuck table, the protective member side of the wafer for which the protective member sticking step has been carried out and positioning, from a back side of the substrate, a cutting blade to an area corresponding to the division line to form cut grooves in such a manner that the cutting blade does not reach the functional layer and part of the substrate is left. The wafer processing method further includes a wafer supporting step of sticking a dicing tape onto the back side of the substrate of the wafer for which the cut groove forming step has been carried out and supporting a peripheral part of the dicing tape by a ring-shaped frame, and removing the protective member, and a functional layer cutting step of irradiating a laser beam along the division lines formed in the functional layer forming the wafer for which the wafer supporting step has been carried out to perform ablation processing for the functional layer and cut the functional layer. In the cut groove forming step, the cut grooves are formed along the division lines in such a manner that an uncut part is left in a peripheral area of the wafer.

In the wafer processing method of the invention of the present application, the following operation and effects are achieved because the wafer processing method includes the cut groove forming step of holding, on the chuck table, the protective member side stuck onto the surface of the functional layer of the wafer and positioning, from the back side of the substrate, the cutting blade to the area corresponding to the division line to form the cut grooves in such a manner that the cutting blade does not reach the functional layer and part of the substrate is left, the wafer supporting step of sticking the dicing tape onto the back side of the substrate of the wafer for which the cut groove forming step has been carried out and supporting the peripheral part of the dicing tape by the ring-shaped frame, and removing the protective member, and the functional layer cutting step of irradiating the laser beam along the division lines formed in the functional layer of the wafer for which the wafer supporting step has been carried out to perform the ablation processing for the functional layer and cut the functional layer.

(1) Even if a fused material adheres to a side surface of a laser-processed groove formed in the functional layer by the ablation processing based on the functional layer cutting step, the problem that a crack is suddenly caused at the periphery of the device due to the contact of the cutting blade is eliminated because the laser-processed groove is not cut by the cutting blade.

(2) Even when removal of the functional layer in the ablation processing based on the functional layer cutting step is insufficient, the wafer can be divided into the individual devices if the laser-processed grooves reach the cut grooves formed from the back side of the substrate. Therefore, since the laser-processed groove is not cut by the cutting blade, the problem that peeling occurs in the functional layer is eliminated.

(3) The laser-processed grooves having a width exceeding the width of the cutting blade do not need to be formed. Therefore, the width of the division lines can be set small and the number of devices that can be formed in the wafer can be increased.

(4) Even if a passivation film including $SiO_2$, SiN, or the like is formed on the surface of the functional layer, when the functional layer is irradiated with the laser beam along the division line in the functional layer cutting step, the energy escapes to the cut groove formed from the backside of the substrate. Thus, the problem of the so-called undercut phenomenon is eliminated.

The above and other objects, features and advantages of the present invention and the manner of realizing them will become more apparent, and the invention itself will best be understood from a study of the following description and appended claims with reference to the attached drawings showing a preferred embodiment of the invention.

DETAILED DESCRIPTION OF THE PREFERRED EMBODIMENT

A mode (embodiment) for carrying out the present invention will be described in detail with reference to the drawings. The present invention shall not be limited by contents described in the following embodiment. Furthermore, constituent elements described in the following include what can be easily assumed by those skilled in the art and substantially the same elements. Moreover, configurations described in the following can be combined with each other as appropriate. Furthermore, various kinds of omission, replacement, or change of configurations can be carried out without departing from the gist of the present invention.

Figure 1A:
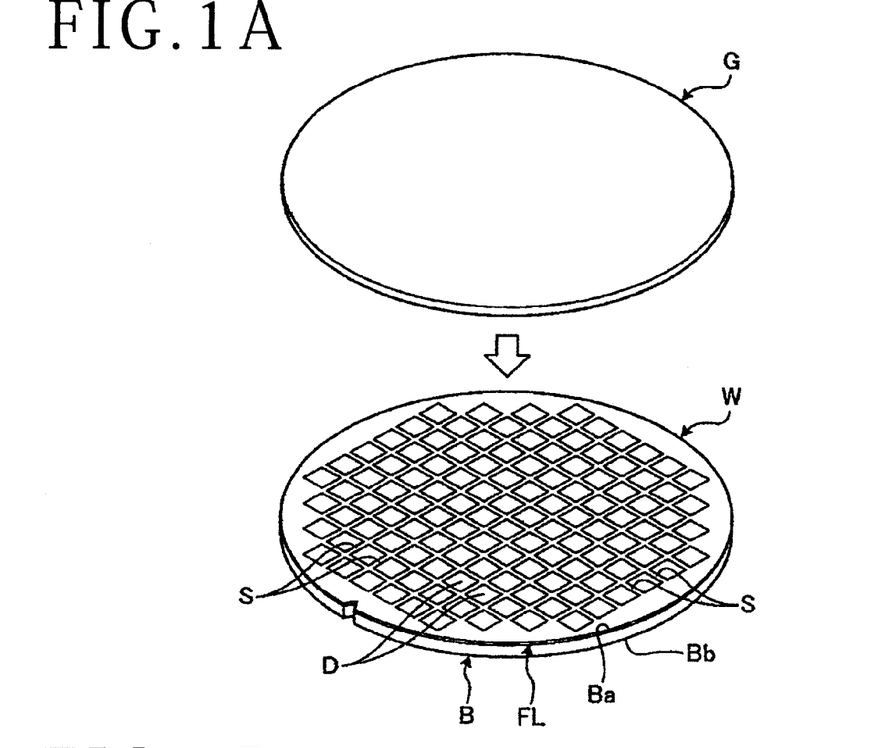
FIG. 1A is a perspective view showing a wafer and a protective member before a protective member sticking step.
Figure 1B:
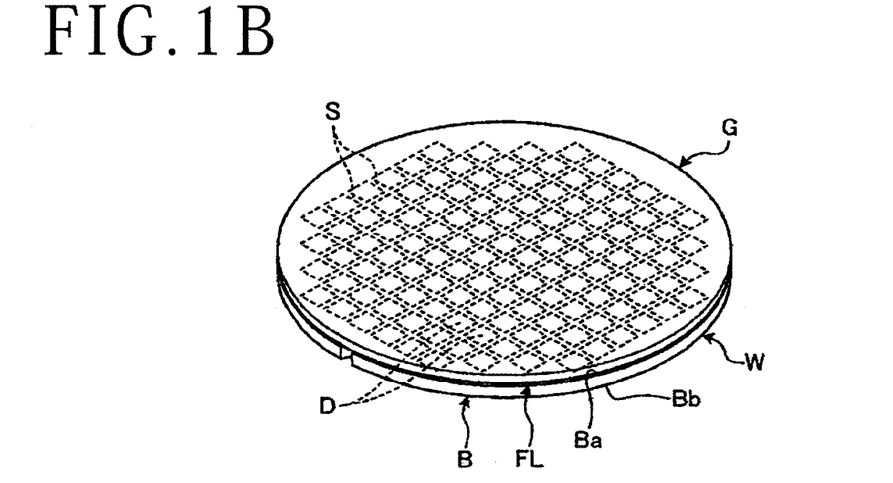
FIG. 1B is a perspective view showing a state after the protective member sticking step.

A wafer processing method according to the embodiment (hereinafter, referred to simply as the processing method) is a processing method for processing a wafer W shown in FIG. 1 and is a method in which cut grooves CR (shown in FIG. 4 and so forth) are formed from a back side Bb of a substrate B of a wafer W having a front side Ba on which a functional layer FL is stacked and then the functional layer FL is irradiated with a laser beam L (shown in FIG. 6) to divide the wafer W into individual devices D. As shown in FIG. 1, the wafer W as a processing target to be divided into the individual devices D by the processing method according to the present embodiment includes the substrate B composed of a semiconductor wafer or an optical device wafer with a circular plate shape whose base material is silicon, sapphire, gallium, or the like with a thickness of 140 μm and the functional layer FL obtained by stacking an insulating film and a functional film to form circuitry over the front side Ba of the substrate B. The wafer W is one in which the devices D such as ICs and LSIs are formed in plural areas partitioned by plural division lines S formed in a lattice manner in the functional layer FL stacked on the front side Ba of the substrate B.

Figure 4A:
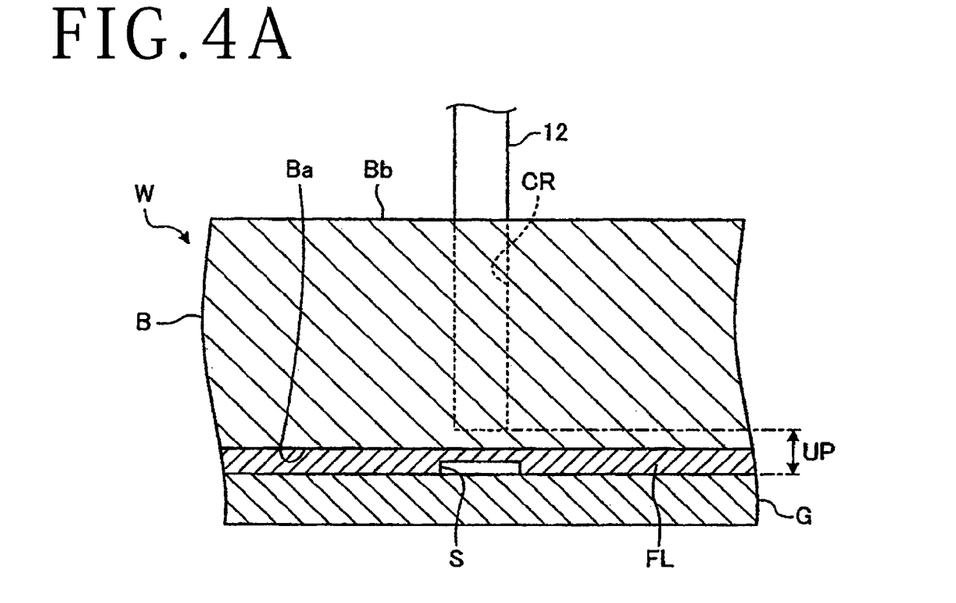
FIG. 4A is another sectional view showing the state in which the wafer is cut into with the cutting blade in the cut groove forming step.
Figure 4B:
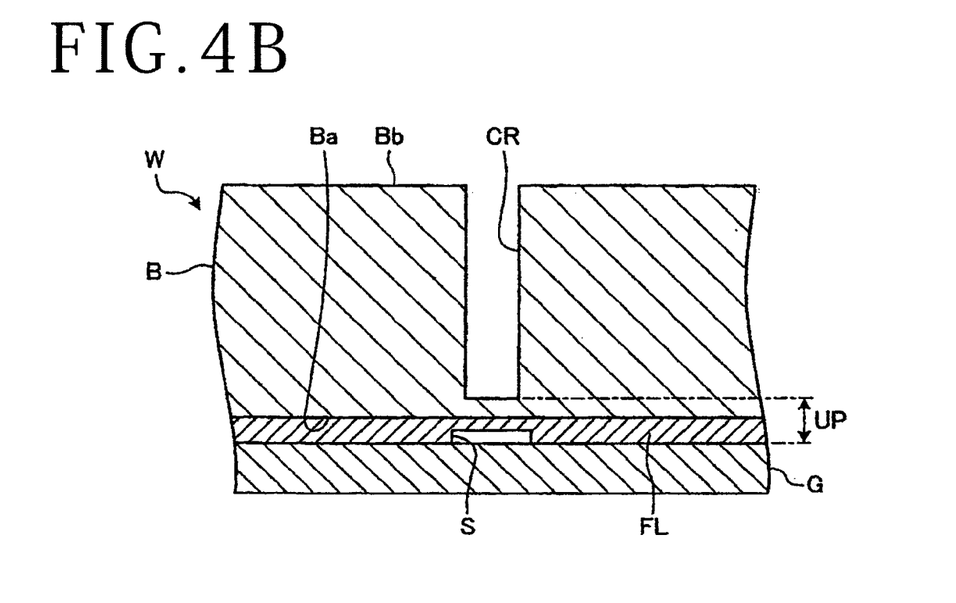
FIG. 4B is another sectional view showing the state in which the cut groove is formed in the cut groove forming step.

In the present embodiment, the insulating film forming the functional layer FL is composed of a low dielectric constant insulator coat (Low-k film) formed of an $SiO_2$ film or a film based on an inorganic substance such as SiOF or BSG (SiOB) or a film based on an organic substance as a polymer film of a polyimide-based material, a parylene-based material, or the like. The thickness of the insulating film is set to 10 μm. As shown in FIG. 4, the front side of the functional layer FL on the division line S is formed to have a slightly-lower height than the front side of the functional layer FL forming the device D.

The processing method according to the embodiment is a processing method for dividing the wafer W along the division lines S and includes a protective member sticking step, a cut groove forming step, a wafer supporting step, and a functional layer cutting step.

In the processing method according to the embodiment, first, in the protective member sticking step, a protective member G is set opposed to the functional layer FL forming the wafer W as shown in FIG. 1A. Then, as shown in FIG. 1B, the protective member G is stuck onto the surface of the functional layer FL in order to protect the devices D. As the protective member G, a resin sheet such as a polyethylene film or a hard plate having rigidity, such as a glass substrate, can be used. Then, the processing method proceeds to the cut groove forming step.

Figure 2:
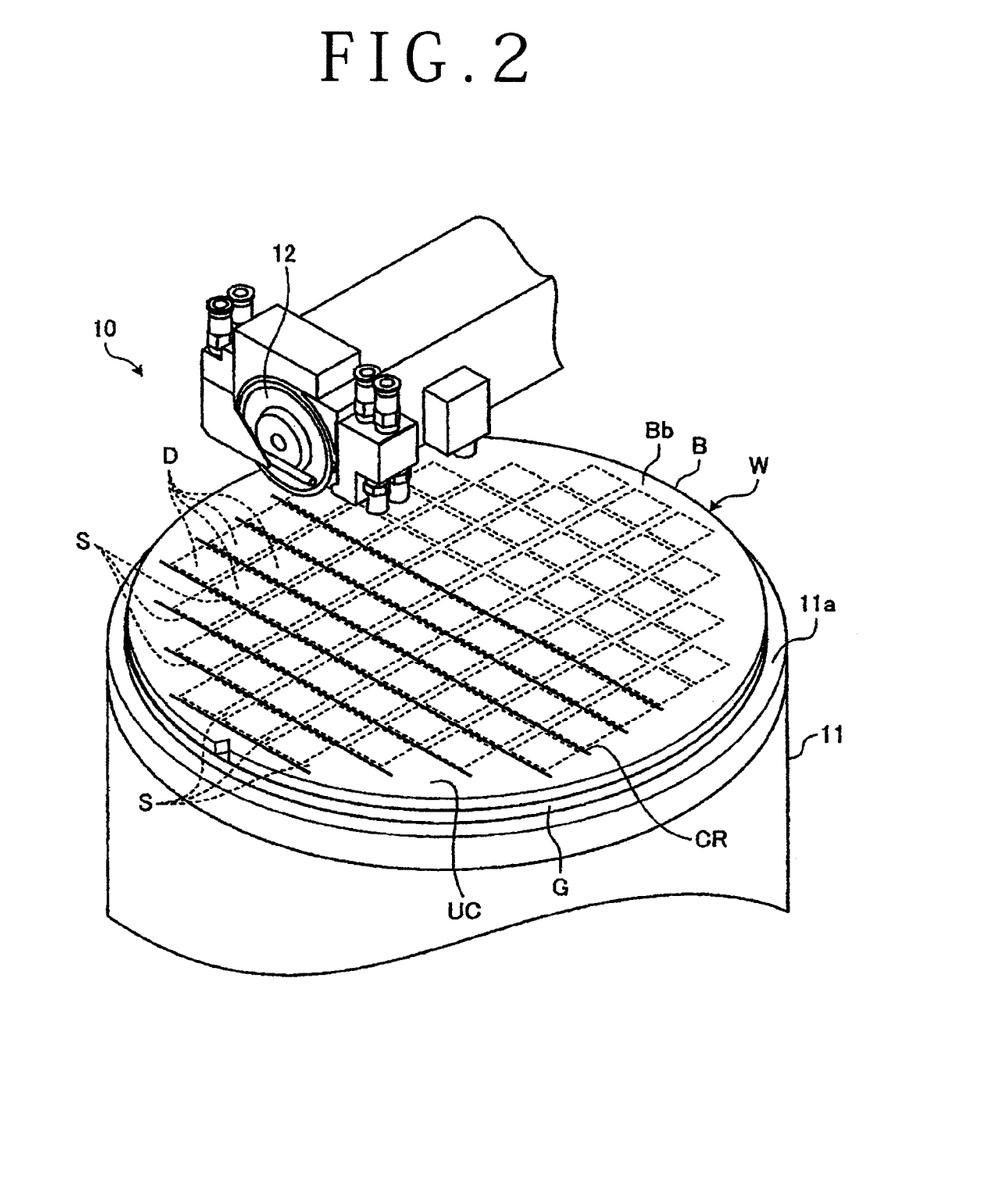
FIG. 2 is a perspective view showing the outline of a cut groove forming step.

In the cut groove forming step, the protective member G side of the wafer W for which the protective member sticking step has been carried out is placed on a holding surface 11a of a chuck table 11 of cutting apparatus 10 (shown in FIG. 2). Then, suction through the holding surface 11a is performed by a vacuum suction source connected to the chuck table 11 via a vacuum suction channel (not shown) to hold, by the suction, the wafer W over the holding surface 11a of the chuck table 11 with the intermediary of the protective member G. Then, based on an image acquired by imaging means (not shown) having an infrared CCD or the like in the cutting apparatus 10, image processing such as pattern matching for positional alignment between the area on the back side Bb of the substrate B corresponding to the division line S and a cutting blade 12 (shown in FIG. 2) is executed to perform the alignment.

Figure 3A:
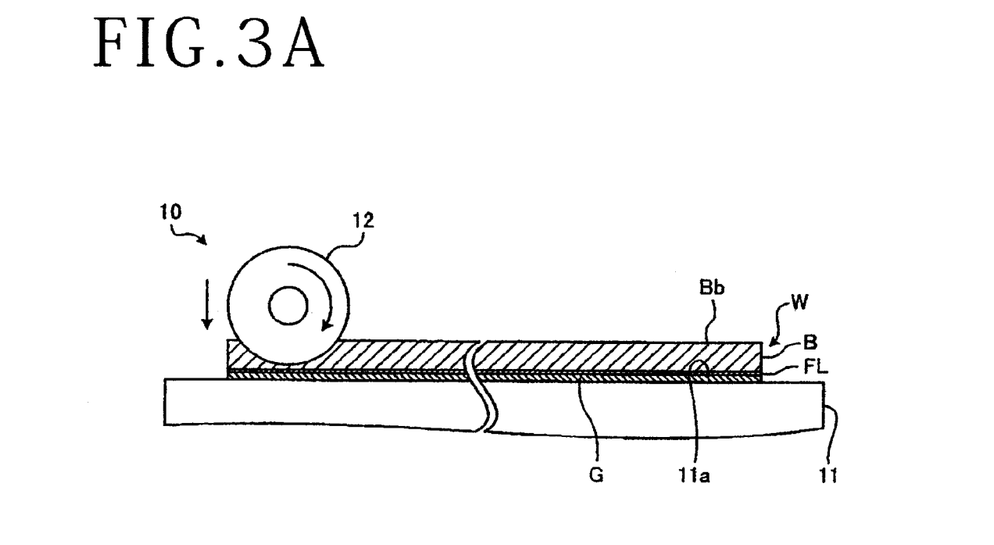
FIG. 3A is a sectional view showing a state in which the wafer is cut into with a cutting blade in the cut groove forming step.

Thereafter, the cutting blade 12 is positioned to the area corresponding to the division line S from the back side Bb of the substrate B and the cut grooves CR (shown in FIGS. 3 and 4 and so forth) are sequentially so formed that the cutting blade 12 does not reach the functional layer FL and part of the substrate B is left. In forming the cut groove CR in the area corresponding to the division line S, the cutting blade 12 is set opposed to a position slightly closer to the center relative to one end of the area corresponding to the division line S and then, as shown in FIG. 3A, the wafer W is cut into with the cutting blade 12 in such a manner that the cutting blade 12 does not reach the functional layer FL so that an uncut portion UP (shown in FIGS. 4A and 4B) with a thickness of e.g. about 30 μm from the front side of the functional layer FL may be left.

Figure 3B:
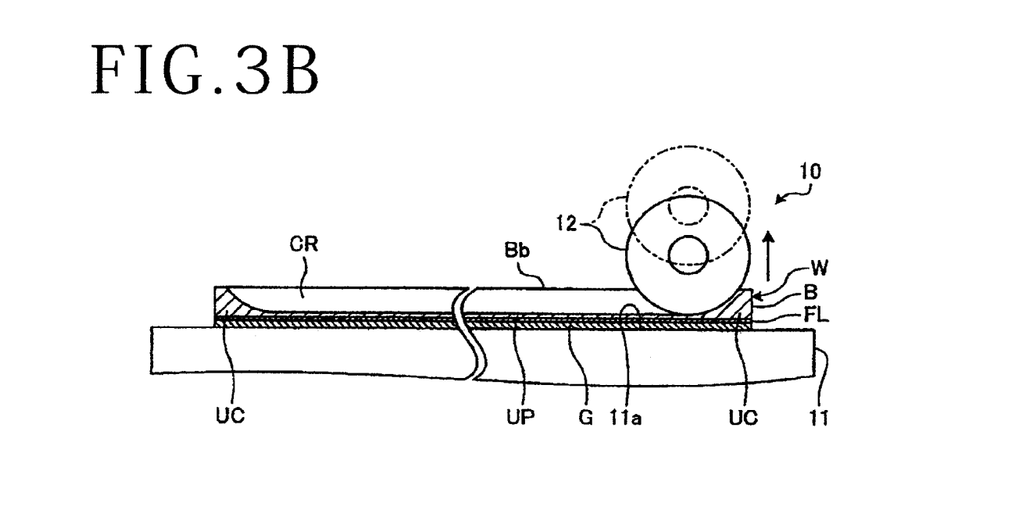
FIG. 3B is a sectional view showing a state in which a cut groove is formed in the cut groove forming step.

Then, the chuck table 11 is moved to move the cutting blade 12 toward the other end of the division line S. Thereafter, after the cutting blade 12 is located at a position slightly closer to the center relative to the other end of the area corresponding to the division line S as shown in FIG. 3B, the cutting blade 12 is lifted up as shown by dotted lines in FIG. 3B. In this manner, in the cut groove forming step, the cut grooves CR are formed along the division lines S, with an uncut part UC (shown in FIGS. 2 and 3B) left in the peripheral area of the wafer W. That is, in the cut groove forming step, the uncut part UC for which the cutting processing with the cutting blade 12 is not carried out is formed in the peripheral area of the wafer W across the whole circumference of the wafer W. After the cut grooves CR are formed in all of the areas corresponding to the division lines S, the processing method proceeds to the wafer supporting step.

Figures 5A, 5B:
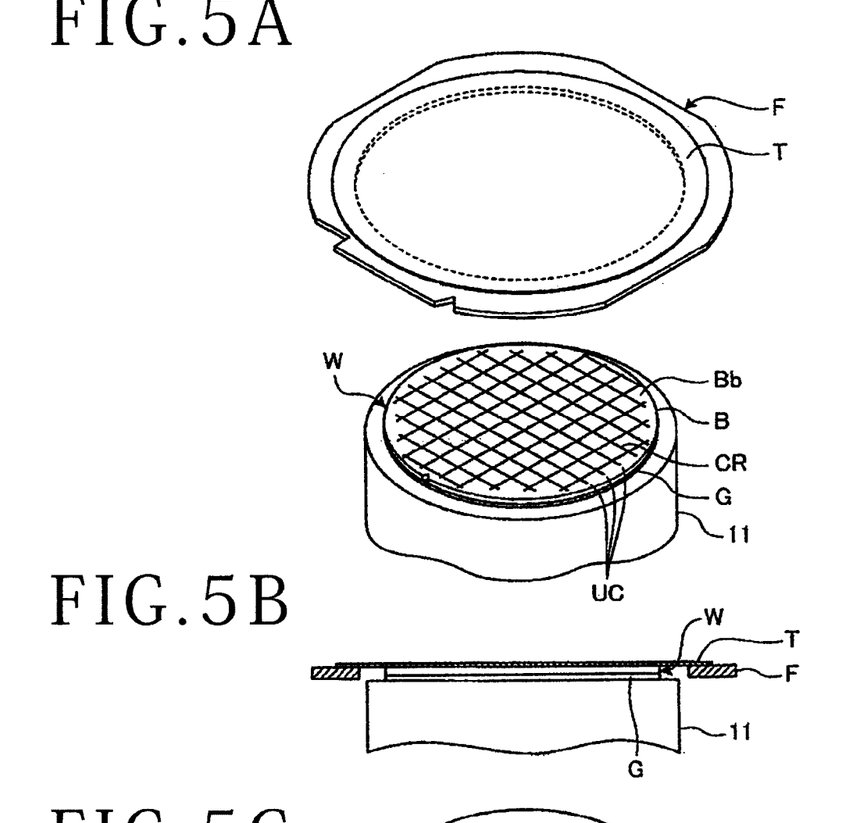
FIG. 5A is a perspective view of the wafer and so forth showing a state before a wafer supporting step.
FIG. 5B is a sectional view showing a state in which a dicing tape is stuck onto the wafer in the wafer supporting step.
Figure 5C:
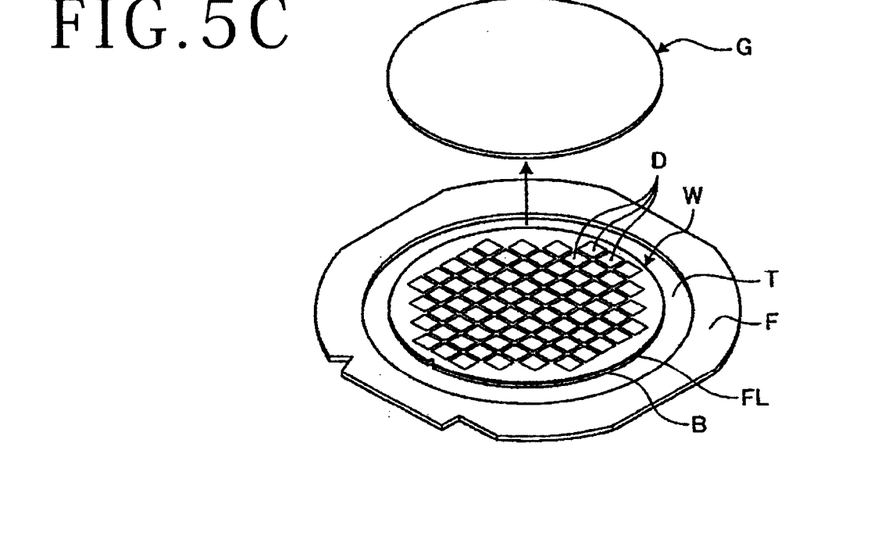
FIG. 5C is a perspective view showing a state in which the protective member is removed from the wafer in the wafer supporting step.

In the wafer supporting step, as shown in FIG. 5A, a surface on which an adhesive layer is provided in a dicing tape T whose peripheral part is mounted on a back side of a ring-shaped frame F having an opening with such a size as to accommodate the wafer W therein in such a manner as to cover the opening is set opposed to the back side Bb of the substrate B of the wafer W held by the chuck table 11. Then, the dicing tape T and the wafer W are relatively brought close to each other. Then, as shown in FIG. 5B, the dicing tape T is stuck onto the back side Bb of the substrate B forming the wafer W for which the cut groove forming step has been carried out and the peripheral part of the dicing tape T is supported by the ring-shaped frame F. Subsequently, as shown in FIG. 5C, the protective member G stuck onto the surface of the functional layer FL forming the wafer W is removed. Then, the processing method proceeds to the functional layer cutting step. As above, by leaving the uncut part UC in the peripheral area of the wafer W, the rigidity of the area in which the cut grooves CR are formed in the wafer W can be improved. This can suppress an unexpected crack progressing from the cut groove CR due to the deflection of the wafer W in the wafer supporting step or shock at the time of transportation.

Figure 6:
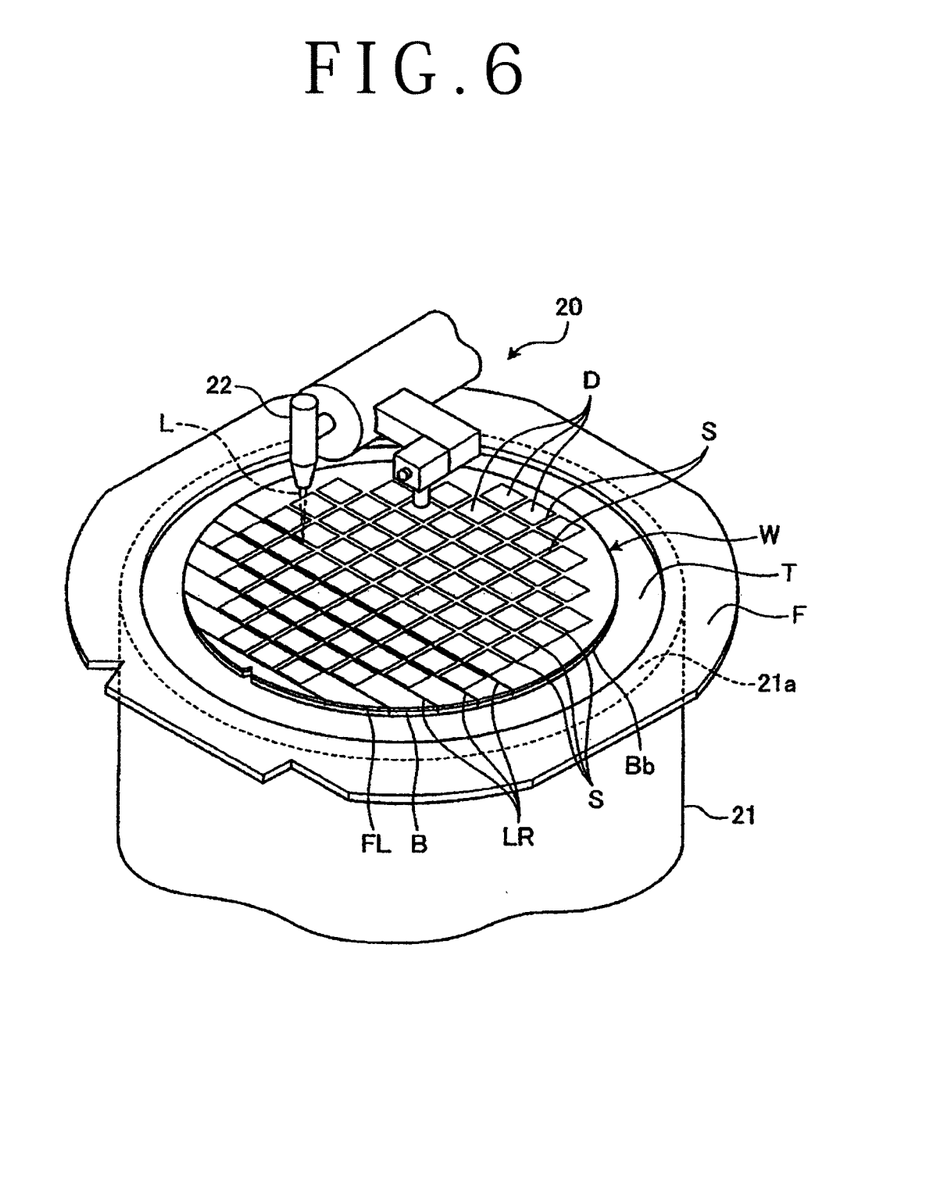
FIG. 6 is a perspective view showing the outline of a functional layer cutting step.

In the functional layer cutting step, the wafer W is placed over a porous holding surface 21a of a chuck table 21 (shown in FIG. 6) of laser processing apparatus 20 that irradiates the wafer W for which the wafer supporting step has been carried out with a laser beam L with the intermediary of the dicing tape T. Suction through the holding surface 21a is performed by a vacuum suction source connected to the chuck table 21 via a vacuum suction channel (not shown) to hold, by the suction, the back side Bb of the substrate B of the wafer W by the holding surface 21a of the chuck table 21 with the intermediary of the dicing tape T as shown in FIG. 6.

Figure 7:
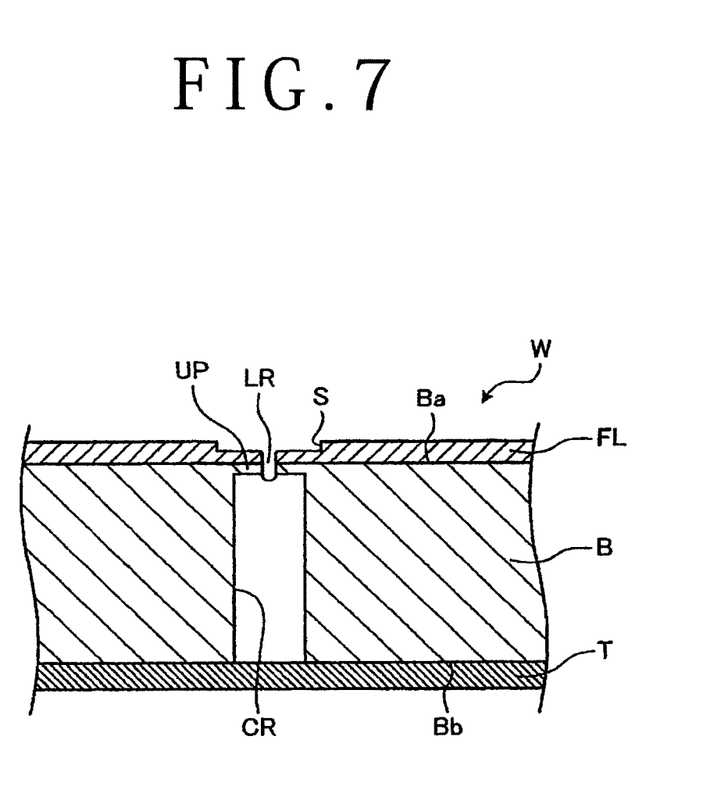
FIG. 7 is a sectional view of the major part of the wafer for which a wafer processing method according to an embodiment has been carried out.

Then, alignment is performed based on an image acquired by imaging means (not shown) in the laser processing apparatus 20. Thereafter, while the chuck table 21 and laser beam irradiating means 22 of the laser processing apparatus 20 are moved relative to each other by moving means, the division lines S are sequentially irradiated with a laser beam L having such a wavelength (e.g. 355 nm) as to be absorbable by the wafer W along the division lines S formed in the functional layer FL forming the wafer W held by the chuck table 21 as shown in FIG. 6. In this way, as shown in FIG. 7, each of laser-processed grooves LR reaching the cut groove CR is formed in the uncut portion UP including the functional layer FL and a cutting residue of the substrate B left in the cut groove forming step. As a result, the uncut portion UP left in the cut groove forming step is subjected to ablation processing to be cut.

The laser-processed groove LR formed in the uncut portion UP including the functional layer FL and the cutting residue of the substrate B in the functional layer cutting step is smaller than the cut groove CR in width as shown in FIG. 7. Therefore, the width of the division lines S can be set small and the number of devices D that can be formed in the wafer W can be increased. After the laser-processed grooves LR are formed in all division lines S, the dicing tape T to which the wafer W is stuck is expanded and the wafer W is divided into the individual devices D along the division lines S. Then, the individual divided devices D are removed from the dicing tape T and conveyed to a tray (not shown) or a die bonding step as the next step.

According to the processing method in accordance with the embodiment, the functional layer cutting step, in which ablation processing is performed for the functional layer FL, is carried out after the cut groove forming step. Therefore, even if a fused material adheres to a side surface of the laser-processed groove LR formed in the functional layer FL by the ablation processing based on the functional layer cutting step, the problem that a crack is suddenly caused at the periphery of the device D due to the contact of the cutting blade 12 can be eliminated because the laser-processed groove LR is not cut by the cutting blade 12.

Furthermore, the cut grooves CR are formed from the back side Bb of the substrate B of the wafer W in the cut groove forming step and the functional layer FL stacked on the front side Ba of the substrate B is subjected to the ablation processing in the functional layer cutting step. Therefore, even when the cutting of the functional layer FL in the ablation processing based on the functional layer cutting step is insufficient, the wafer W can be divided into the individual devices D if the laser-processed grooves LR reach the cut grooves CR formed from the back side Bb of the substrate B. Therefore, because the laser-processed groove LR is not cut by the cutting blade 12, the problem that peeling occurs in the functional layer FL can be eliminated.

Moreover, the laser-processed grooves LR having a width exceeding the width of the cutting blade 12 do not need to be formed because the cut grooves CR are formed from the back side Bb of the substrate B of the wafer W in the cut groove forming step and the functional layer FL stacked on the front side Ba of the substrate B is subjected to the ablation processing in the functional layer cutting step. Therefore, the width of the division lines S can be set small and the number of devices D that can be formed in the wafer W can be increased.

The cut grooves CR are formed from the back side Bb of the substrate B of the wafer W in the cut groove forming step and the functional layer FL stacked on the front side Ba of the substrate B is subjected to the ablation processing in the functional layer cutting step. Therefore, even if a passivation film including $SiO_2$, SiN, or the like is formed on the surface of the functional layer FL, when the functional layer FL is irradiated with the laser beam L along the division line S in the functional layer cutting step, the energy escapes to the cut groove CR formed from the back side Bb of the substrate B. Thus, the problem of the so-called undercut phenomenon can be eliminated.

Moreover, in the cut groove forming step, the cut grooves CR are so formed that the uncut part UC is left in the peripheral area of the wafer W. This can improve the rigidity of the area in which the cut grooves CR are formed in the wafer W. Therefore, it is possible to suppress an unexpected crack progressing from the cut groove CR due to the deflection of the wafer W in the middle of handling of sticking the dicing tape T onto the back side Bb of the substrate B of the wafer W and removing the protective member G in the wafer supporting step or shock at the time of transportation.

The present invention is not limited to the details of the above described preferred embodiment. The scope of the invention is defined by the appended claims and all changes and modifications as fall within the equivalence of the scope of the claims are therefore to be embraced by the invention.

What is claimed is:

1. A wafer processing method for dividing, along a plurality of division lines, a wafer in which devices are formed in a plurality of areas partitioned by the division lines formed in a lattice manner in a functional layer formed on a front side of a substrate, the wafer processing method comprising:
    a protective member sticking step of sticking a protective member onto a surface of the functional layer of the wafer;
    a cut groove forming step of holding, on a chuck table, the protective member side of the wafer for which the protective member sticking step has been carried out and positioning, from a back side of the substrate, a cutting blade to an area corresponding to the division line to form cut grooves in such a manner that the cutting blade does not reach the functional layer and part of the substrate is left;
    a wafer supporting step of sticking a dicing tape onto the back side of the substrate of the wafer for which the cut groove forming step has been carried out and supporting a peripheral part of the dicing tape by a ring-shaped frame, and removing the protective member; and
    a functional layer cutting step of irradiating a laser beam along the division lines formed in the functional layer of the wafer for which the wafer supporting step has been carried out to perform ablation processing for the functional layer and cut the functional layer and an uncut portion of the substrate to thereby form a laser processed groove reaching the cut groove,
    wherein
    in the cut groove forming step, the cut grooves are formed along the division lines in such a manner that an uncut part is left in a peripheral area of the wafer.

* * * * *